United States Patent [19]

Gehrig et al.

[11] Patent Number: 4,939,684

[45] Date of Patent: Jul. 3, 1990

[54] SIMPLIFIED PROCESSOR FOR DIGITAL FILTER APPLICATIONS

[75] Inventors: Wilfried Gehrig, March; Werner Reich, Emmendingen, both of Fed. Rep. of Germany

[73] Assignee: Deutsche ITT Industries GmbH, Freiburg, Fed. Rep. of Germany

[21] Appl. No.: 351,627

[22] Filed: May 12, 1989

[30] Foreign Application Priority Data

Jun. 2, 1988 [EP] European Pat. Off. ........ 88108833.0

[51] Int. Cl.$^5$ ......................... G06F 15/31; G06F 7/52
[52] U.S. Cl. ................................ 364/724.01; 364/736
[58] Field of Search ...................... 364/754, 757–760, 364/736, 724.01

[56] References Cited

U.S. PATENT DOCUMENTS

| 4,538,239 | 8/1985 | Magar | 364/759 |
| 4,594,678 | 6/1986 | Uhlenhoff | 364/736 |
| 4,598,382 | 7/1986 | Sato | 364/757 |

OTHER PUBLICATIONS

Electronic Design, Book 34 (1986) Feb. 20., No. 4, Hasbrouck Heights, N.J., B. Eichen, et al.: "Floating-Point Math Integrated on Chip Makes DSP IC a Standout".

Electronik, Band 35, No. 18, Sep. 5, 1986, pp. 112–118, 121–125, Munchen, Deutschland, R. Gluth: "Integrierte Signalprozessoren".

Primary Examiner—Gary V. Harkcom
Assistant Examiner—Tan V. Mai
Attorney, Agent, or Firm—Thomas L. Peterson

[57] ABSTRACT

An arithmetic logic unit (ALU) of a digital processor includes a multiplier to which a first data word A and a second data word B are fed as input data from a data memory. A third data word C, also coming from the data memory, is fed through a barrel shifter, whose shift number is q. The output of the barrel shifter is fed to one input of an adder having its other input connected to the output of the multiplier. The output of the adder provides a fourth data word D, which is written into the data memory. All movements of data necessary to form the fourth data word D are defined of a single program instruction.

10 Claims, 1 Drawing Sheet

SIMPLIFIED PROCESSOR FOR DIGITAL FILTER APPLICATIONS

BACKGROUND OF THE INVENTION

1. Field of the Invention

The present invention relates to digital processors, and, more particularly, to digital processors having a reduced instruction set for use in digital filter technology and the like.

2. Description of the Related Art

Digital signal processing systems usually contain a processor, which is the nerve center of the system and processes the data loaded into it in accordance with a program sequence that depends on the task to be performed, with the possibilities provided by the circuit elements having to be taken into account. The respective program sequence is either hard-wired or stored as an instruction set in a program memory, a combination of the two possibilities being generally most effective. The program memory itself may be a read-only memory ("ROM"), a random-access memory ("RAM"), or a combination of the two. If the processor is produced in large numbers, the fixed program and the fixed constants or coefficients will mostly be contained in the ROM, while the associated variable data will be stored in the RAM.

Actual signal processing takes place in the arithmetic logic unit ("ALU"), which generally contains an adder or accumulator, a multiplier, and some logic elements, such as a shifting device The central control unit is in most cases the program memory, which initiates the individual control operations required to perform the functions specified, e.g., movements of data within the arithmetic unit or between the latter and the addressable memory locations. The stored program contains the various control instructions or initiates their execution. The sequence of operations is controlled by the program counter.

Commercially available processors generally include large numbers of different instructions which can be combined into program sequences to ensure as universal applicability as possible Where universal applicability is not important, the processor can be made much smaller.

SUMMARY OF THE INVENTION

The present invention provides a simple processor which serves to perform a given logical operation on three operands such as occur in digital filter technology, and which is suitable for integration.

BRIEF DESCRIPTION OF THE DRAWINGS

The invention will now be explained in greater detail with reference to the accompanying drawing, in which.

DETAILED DESCRIPTION OF THE PREFERRED EMBODIMENT

Figure 1:
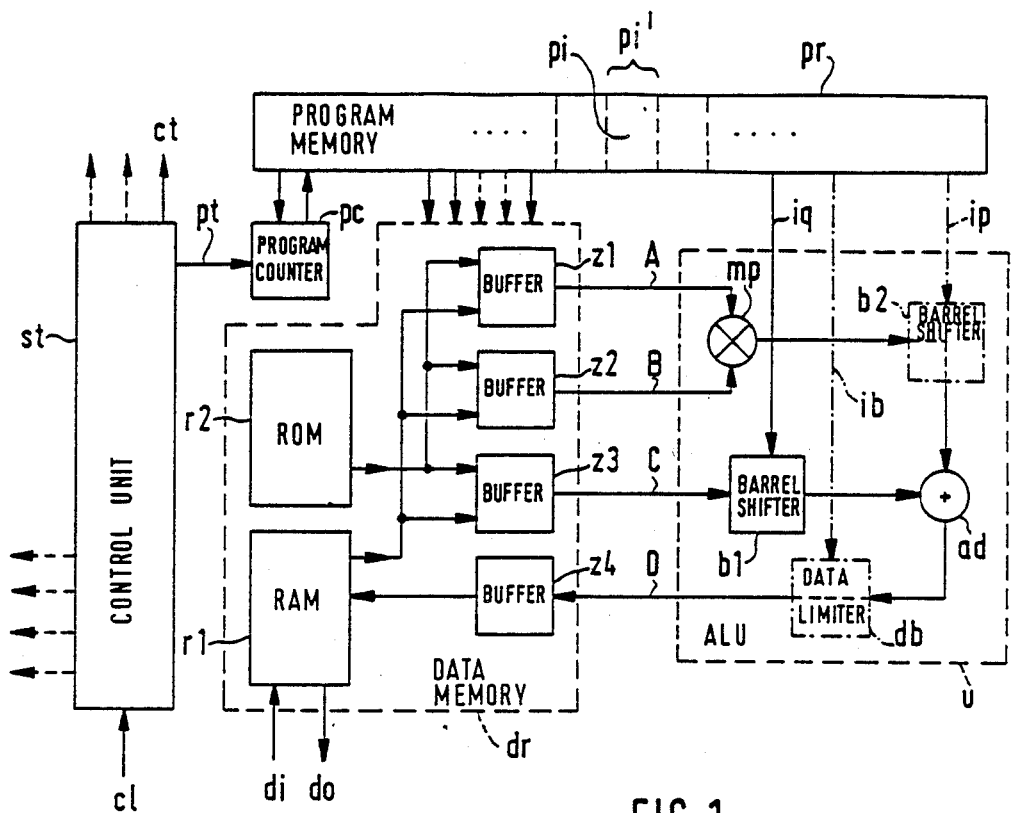
FIG. 1 is a block diagram of an embodiment of the processor according to the invention.

FIG. 1 is a block diagram of a processor constructed in accordance with the present invention. The block diagram illustrates only the essential parts of the processor according to the invention. It should be understood that a complete processor includes, for example, a power supply, a clock generator for the generation of a system clock cl, and input/output stages which are not shown in FIG. 1.

The processor comprises an ALU u, a data memory dr, a control unit st and a program memory pr. A first data word A and a second data word B are fed to a single multiplier mp in the ALU u. A third data word C is fed to the ALU u and is applied to the data input of a shifting device, which, in the embodiment of FIG. 1, is formed by a first barrel shifter b1. The first barrel shifter b1 receives shift instructions iq, as represented by a control line iq in FIG. 1, from the program memory pr. The output of the first barrel shifter b1 is coupled to one input of an adder ad, whose other input is connected to the output of the multiplier mp.

A second barrel shifter b2, through which the output signal from the multiplier mp is passed, may be provided in an alternative preferred embodiment of the present invention and is therefore shown in phantom. The second barrel shifter b2 receives shift instructions ip, as represented by a control line ip (shown in phantom), from the program memory pr.

If the binary number system is used, the two barrel shifters b1, b2 multiply the applied numerical value by a power of two, the exponent being a positive or negative integer which is transferred as a shift number q to the first barrel shifter b1 by means of the shift instruction iq and as a shift number p to the second barrel shifter b2 by means of the shift instruction ip.

The output of the adder ad provides a fourth data word D, which is stored in the data memory dr. FIG. 1 illustrates a preferred embodiment in which the fourth data word D passes within the ALU u through a data limiter db (shown in phantom), which, after being activated by a limiting instruction ib, received from the program memory pr via a control line ib (shown in phantom), limits the value of the fourth data word D and, hence, the data overflow error.

The data memory dr, shown in FIG. 1, comprises a read-only memory ("ROM") r2 for storing constants and a random-access memory ("RAM") r1 for storing input data di entered from outside the processor. The RAM r1 also stores the fourth data words D generated by the ALU u.

The data memory dr includes a first buffer z1, a second buffer z2, a third buffer z3 and a fourth buffer z4, which store the four data words, A, B, C, D, respectively. The four buffers z1, z2, z3, z4 serve to compensate for the different speeds at which the RAM r1, the ROM r2 and the ALU u can handle data. In the preferred embodiment of FIG. 1, the access time of the RAM r1 or the ROM r2 is considerably shorter than the execution time of the ALU u. Thus, the data is transferred between the ALU u and the data memory dr via the buffers z1, z2, z3, z4 using time-division multiplexing The first three data words A, B, and C, which are loaded into the first, second, and third buffers z1, z2 and z3, respectively, are either internal data from the ROM r2 or external data di from the RAM r1. The respective data lines are shown to provide the interconnections. The fourth buffer z4 writes its output data into the RAM r1, from which it can be read as output data do to an external device. Address selection in the memories is effected by control signals from the program memory pr.

The respective control signals to the ALU u and the data memory dr are selected from within the program memory pr by a program address pi' to be read out. The program sequence is defined by the program instructions for the processor stored sequentially in the program memory pr. The program sequence is controlled by a program counter pc, which is connected to both the control unit st and the program memory pr. The control unit st derives a clock signal pt that controls the program counter pc and other clock signals (e.g., the sampling clock ct and other clock signals not described herein), from the system clock cl.

In response to a single program instruction pi, the processor performs the following arithmetic operation:

$$D = (A \times B) + C \times 2^q,$$

with the program instruction pi stored in the program memory pr being, for example:

D', A', B', C', q, where D', A', B', C' are the respective addresses of the four associated data words D, A, B, C in the data memory dr, and q is the associated shift number of the barrel shifter b1. This instruction, even if available only as a single instruction, permits the implementation of a processor ideally suited for specific applications.

By means of the additional barrel shifter b2, given as an optional device in the embodiment of FIG. 1, the product $A \times B$ can be multiplied again by a power of two. This expands the basic operation described above. The effect of the data limiter db, contained in the processor as another option, follows from a limiting function which, in the event of a data overflow, for example, replaces the overflow number by the largest/smallest possible number.

The advantageous use of the processor will be illustrated by the example of a typical filter implementation. In the third-order filter structure shown in FIG. 2, a digital value U is a time-varying input which is formed by means of the sampling clock ct. This digital value U is multiplied by a first constant c0, a second constant c1, a third constant c2, and a fourth constant c3. The products of the multiplications by the constants c1, c2, c3 and c4 are fed to the first inputs of a first adder a1, a second adder a2, the third adder a3, and a fourth adder a4, respectively.

The time-varying output of the digital filter is a digital value Y. The output is multiplied by a fifth constant d0, a sixth constant d1, and a seventh constant d2. The products of the multiplications by the constants d0, d1 and d2 are fed to respective second inputs of the first adder a1, the second adder a2 and the third adder a3, whose outputs are a first digital state variable X1, a second digital state variable X2 and a third digital state variable X3, respectively. The digital state variables are delayed by a first state memory dt1, a second state memory dt2 and a third state memory dt3, respectively, and are fed to respective third inputs of the second adder a2, the third adder a3 and the fourth adder a4. The delays provided by the three state memories are equal.

Figure 2:
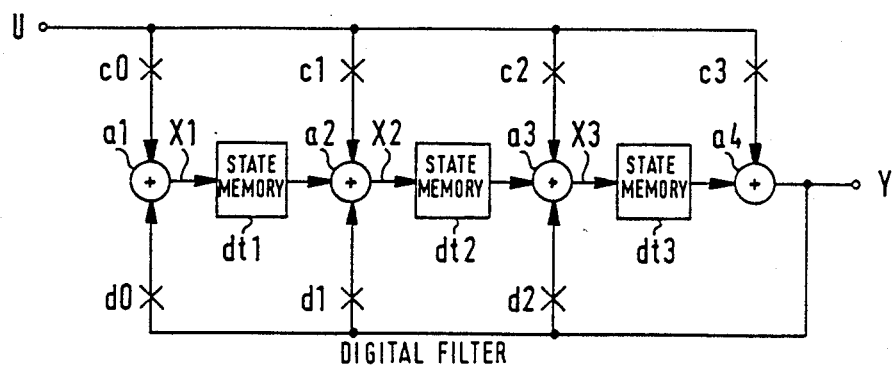
FIG. 2 a circuit diagram which shows how a third-order recursive filter can be implemented with the processor.

To implement the filter structure of FIG. 2 with the processor of FIG. 1 in accordance with the present invention, the state variables X1, X2, X3 are stored in the data memory dr and are called up by a corresponding program instruction pi.

With the processor and the program instruction pi, the filter structure of FIG. 2 can be implemented step by step. The necessary additions of three quantities in the second adder a2 and the third adder a3 are performed in a first intermediate step in which two quantities are added to obtain an intermediate value. The third quantity is then added to the intermediate value in a second intermediate step. The speed of the processor is very high compared with the signal frequency, and the operation performed is very effective. Thus, an extremely short program sequence is obtained despite the intermediate-step solution described. The program execution cycle, which is controlled by the program counter pc, must be completed at least within the sampling period formed by the sampling clock ct.

The structure of and the signal flow in the digital filter of FIG. 2 defines a third-order recursive filter having a transfer function:

$$H(z) = (z^3 a3 + z^2 a2 + za1 + a0)/(z^3 + z^2 b2 + zb1 + b0)$$

where z is the delay through each of the state memories dt1, dt2 and dt3.

A representation of the same transfer function which is better suited for the processor described is:

$$H(z) = v(z^3 c3 + z^2 c2 + zc1 + c0)/(z^3 - z^2 d2 - zd1 - d0)$$

where $c0 = 2^q$, $v = a0/c0$, $c3 = a3/v$, $c2 = a2/v$, $c1 = a1/v$, $d2 = -b2$, $d1 = -b1$, $d0 = -b0$.

In the second representation above, a constant v has been factored out of the numerator of the transfer function in such a way that the coefficient c0 becomes a power of two. Leaving the coefficient v out of consideration, a genuine multiplication has thus been exchanged for a simpler multiplication by a power of two. Since in many applications a cascade of filters has to be realized, the product of all coefficients v of the cascaded filters need to be formed only once by a genuine multiplication (e.g., at the beginning or end of the cascade). This approach is particularly efficient if, as is very often the case, the cascade consists of first-order and/or second-order filter subnetworks.

The equations given in the following "TABLE WITH EXAMPLE OF FILTER COMPUTATION" follow from the structure of the exemplary filter of FIG. 2. The left-hand portion of the table contains the equations, except for the coefficient v, with which the third-order filter can be implemented. The right-hand portion of the table shows the associated program instructions pi. Two equations must be realized in two program steps each. The program sequence given on the right-hand side shows that the filter can be implemented with six successive instructions. An Nth-order filter can be implemented with $2 \times N$ instructions. This shows that the instruction used as the basic operation is highly efficient.

| TABLE WITH EXAMPLE OF FILTER COMPUTATION | | | | | | |
|---|---|---|---|---|---|---|
| | | Program Instruction | | | | |
| Equation | Step | D | A | B | C | q |
| Y = X3 + U × c3 | p1: | Y | c3 | U | X3 | 0 |
| X3 = X2 + U × c2 + Y × d2 | p2: | X3 | c2 | U | X2 | 0 |
| | p3: | X3 | d2 | Y | X3 | 0 |
| X2 = X1 + U × c1 + Y × d1 | p4: | X2 | c1 | U | X1 | 0 |
| | p5: | X2 | d1 | Y | X2 | 0 |
| X1 = U × c0 + Y × d0 | p6: | X1 | d0 | Y | U | q |

The ALU u of FIG. 1 differs from ALUs commonly used for this purpose in that it has no accumulator. This is advantageous if the ALU u is operated on the pipelining principle. In that case, the result D of an operation is not yet available in the next instruction cycle, but, depending on the depth of the pipeline processing, only much later. To lose no processor time despite that waiting time, the successive instructions of several processes can be interleaved. If, for example, the result D is only available after three program steps, an efficient program will have the following structure:

operation 1 of process 1
operation 1 of process 2
operation 1 of process 3
operation 2 of process 1
operation 2 of process 2
operation 2 of process 3
operation 3 of process 1 etc.

What is claimed is:

1. A processor comprising:
   a program memory that stores a plurality of program instructions that control the operation of said processor;
   a data memory having data inputs and data outputs, said data memory storing a plurality of data words; and
   an arithmetic logic unit, said arithmetic logic unit comprising:
   a multiplier having first and second data inputs and a data output, said first and second data inputs receiving a first data word A and a second data word B, respectively, from said data memory, said data output providing the product of multiplying said data word A and said data word B;
   a shifting device having a data input and a data output, said data input being provided with a third data word C from said data memory, said third data word being provided to said data input of said shifting device at the same time as said first and second data words are provided as inputs to said multiplier, said shifting device having a control input that receives a shift number q from said program memory, said shifting device providing a data word on said data output that is shifted from said data input in accordance with said shift number q; and
   an adder having first and second inputs and an output, said first input receiving a data input responsive to said product output of said multiplier and, at the same time, said second input receiving said data output of said shifting device, a data word responsive to said output of said adder being provided as a fourth data word D to the data inputs of said data memory, where $$D = A \times B + C \times 2^q.$$

2. The processor as defined in claim 1, wherein said shifting device is a barrel shifter.

3. The processor as defined in claim 1, wherein each of said program instructions stored in said program memory is provided as an input to said data memory to control the selection of addresses for said first, second, third and fourth data words A, B, C and D, and as an input to said arithmetic logic unit to control the generation of said fourth data word D from said first, second and third data words A, B, C.

4. The processor as defined in claim 3, wherein each of said program instructions includes data that defines read and write addresses for said data memory, said read and write addresses corresponding to storage locations within said data memory for each of said four data words A, B, C, D, each of said program instructions further including data that defines said shift number q.

5. The processor as defined in claim 4, wherein said program instructions stored in said program memory comprise only a single type of program instruction word.

6. The processor as defined in claim 1, further including a second shifting device having a data input, a data output and a control input, said data input connected to said output of said multiplier, said data output connected to said input of said adder, said control input receiving a shift number p from each of said program instructions stored in said program memory, said second shifting device shifting data at said data input in accordance with said shift number p.

7. The processor as defined in claim 6, further including a data limiter having a data input and a data output, said data input of said data limiter connected to receive said output of said adder, said data output of said data limiter providing said data word D to said data inputs of said data memory, said data limiter further including a control input responsive to a portion of each of said program instructions stored in said program memory, said data limiter being selectively activated to limit the magnitude of said data word D.

8. The processor as defined in claim 6, wherein said second shifting device is a barrel shifter.

9. The processor as defined in claim 1, further comprising:
   a first buffer interposed between said data memory and said arithmetic logic unit to buffer said first data word A;
   a second buffer interposed between said data memory and said arithmetic logic unit to buffer said second data word B;
   a third buffer interposed between said data memory and said arithmetic logic unit to buffer said third data word C; and
   a fourth buffer interposed between said arithmetic logic unit and said data memory to buffer said fourth data word A.

10. The processor as defined in claim 1, wherein said program memory is programmed with a sequence of instructions that control the operation of said arithmetic logic unit and said data memory such that said arithmetic logic unit and said data memory operate as a digital filter.

* * * * *